(12) United States Patent
Jones

(10) Patent No.: US 8,879,439 B2
(45) Date of Patent: Nov. 4, 2014

(54) MULTIPLEXER

(75) Inventor: Steven Jones, Milton Keynes (GB)

(73) Assignee: Cambridge Silicon Radio Limited, Cambridge (GB)

( * ) Notice: Subject to any disclaimer, the term of this patent is extended or adjusted under 35 U.S.C. 154(b) by 539 days.

(21) Appl. No.: 12/886,687

(22) Filed: Sep. 21, 2010

(65) Prior Publication Data
US 2011/0069645 A1    Mar. 24, 2011

(30) Foreign Application Priority Data

Sep. 21, 2009    (GB) .................................... 0916494.8

(51) Int. Cl.
| | | |
|---|---|---|
| *H04L 5/00* | (2006.01) | |
| *H04B 1/38* | (2006.01) | |
| *H04B 1/16* | (2006.01) | |
| *H04B 1/00* | (2006.01) | |
| *H04W 88/06* | (2009.01) | |

(52) U.S. Cl.
CPC ............. *H04B 1/3805* (2013.01); *H04W 88/06* (2013.01); *H04B 1/16* (2013.01); *H03J 2200/11* (2013.01); *H04B 1/0057* (2013.01)
USPC ........................................................ 370/297

(58) Field of Classification Search
None
See application file for complete search history.

(56) References Cited

U.S. PATENT DOCUMENTS

| | | | |
|---|---|---|---|
| 2007/0183348 A1* | 8/2007 | Totsuka et al. | 370/276 |
| 2009/0051604 A1* | 2/2009 | Zhang et al. | 343/702 |

* cited by examiner

*Primary Examiner* — Melvin H Pollack
(74) *Attorney, Agent, or Firm* — RatnerPrestia

(57) ABSTRACT

A multiplexer for a device capable of receiving signals in first and second frequency bands, the multiplexer comprising a first branch for connecting an antenna to a first sub-system configured to process received signals in the first frequency band, a second branch for connecting the antenna to a second sub-system configured to process received signals in the second frequency band, wherein the first branch comprises a filter for attenuating received signals in the second frequency band and the second branch couples the antenna directly to the second sub-system.

8 Claims, 3 Drawing Sheets

MULTIPLEXER

REFERENCE TO RELATED APPLICATION

The present application claims the benefit of U.K. Patent Application No. GB 0916494.8, filed Sep. 21, 2009, whose disclosure is hereby incorporated by reference in its entirety into the present disclosure.

FIELD OF THE INVENTION

The present invention relates to a multiplexer, to a device capable of receiving signals in a plurality of frequency bands and to a front-end module for such a device.

DESCRIPTION OF RELATED ART

Mobile communications devices such as mobile telephones increasingly incorporate multiple functions in a single package. For example, many mobile telephones include a receiver for a positioning system such as the Global Positioning System (GPS) in addition to a radio receiver for receiving radio signals from base stations of a mobile telephone network.

To reduce the number of components in such a device, it is commonplace for the positioning system receiver and the radio receiver to use a single common antenna. This is possible because the frequency band used by the radio receiver, which is typically 925-960 MHz for a GSM radio receiver, is different from the frequency used by the positioning system, which is typically around 1576 MHz for a GPS receiver. This sharing of a common antenna is facilitated by a diplexer, which selectively couples the radio receiver and the positioning system to the single antenna according to the frequency of a signal received by the antenna.

FIG. 1 is a schematic representation of a known architecture for use in a device such as a mobile telephone having GSM and GPS receivers. The architecture 10 has a single antenna 12 which is coupled to a diplexer 14 having parallel first and second branches 16, 18. The first branch 16 includes a low-pass filter 20 with a cut-off frequency at or just above 960 MHz, such that signals with frequencies higher than 960 MHz are blocked. The second branch 18 includes a high-pass filter 22 which has a cut-off frequency at or just below 1576 MHz, such that signals with frequencies below 1576 MHz are blocked. The low-pass filter 20 has an output which is connected to an input of a GSM surface acoustic wave (SAW) filter 24, which passes GSM frequency signals to a GSM sub-system 28, whilst the high-pass filter 22 has an output which is connected to an input of a GPS SAW filter 26, which passes GPS frequency signals to a GPS sub-system 30.

In use of the architecture 10, GSM signals received by the antenna 12 are passed by the low-pass filter 20. allowing them to reach the GSM SAW filter 24 and the GSM sub-system 28, but are blocked by the high-pass-filter 22, preventing them from reaching the GPS sub-system 30. Similarly, GPS signals received by the antenna 12 are passed by the high-pass filter 22 to the GPS SAW filter 26 and on to the GPS sub-system 30, but are blocked by the low-pass filter 20, which prevents them from reaching the GSM sub-system 28.

Whilst the architecture illustrated in FIG. 1 can be effective, it has the disadvantage that the filters 20, 22 each give rise to an insertion loss, thus attenuating any signal received by the antenna 12. Whilst this may not be a particular problem for the GSM sub-system 28, it can give rise to difficulties for the GPS sub-system 30, as a received GPS signal may already be weak.

SUMMARY OF THE INVENTION

According to a first aspect of the invention there is provided a multiplexer for a device capable of receiving signals in first and second frequency bands, the multiplexer comprising a first branch for connecting an antenna to a first sub-system configured to process received signals in the first frequency band and a second branch for connecting the antenna to a second sub-system configured to process received signals in the second frequency band, wherein the first branch comprises a filter for attenuating received signals in the second frequency band and the second branch couples the antenna directly to the second sub-system.

The multiplexer of the present invention permits a single antenna to be used to receive signals in different frequency bands. The multiplexer of the present invention improves the quality of reception of a signal in the second frequency band, as the second branch contains no additional components that could attenuate a received signal, such that the second branch can be said directly to couple the antenna to the second sub-system. The only attenuation of the received signal is that which occurs as a result of the signal passing through the second branch. Additionally, the multiplexer of the present invention includes fewer components than prior art multiplexers and thus has a lower bill of materials cost than prior art systems, whilst permitting greater design flexibility.

Preferably the second branch does not include a filter.

The filter of the first branch may comprise a diplex filter.

The signals in the first frequency band may be transmitted in accordance with a first telecommunications standard and the signals in the second frequency band may be transmitted in accordance with a second telecommunications standard.

The first telecommunications standard may be GSM.

The first telecommunications standard may alternatively be Bluetooth®.

The second telecommunications standard may be GPS.

According to a second aspect of the invention there is provided a receiver for a device capable of receiving signals in a plurality of frequency bands, the receiver comprising an antenna coupled to a multiplexer according to the first aspect of the invention.

According to a third aspect of the invention there is provided a front-end module for a receiver for a device capable of receiving signals in a plurality of frequency bands, the front-end module comprising a multiplexer according to the first aspect of the invention.

BRIEF DESCRIPTION OF THE DRAWINGS

Embodiments of the invention will now be described, strictly by way of example only, with reference to the accompanying drawings, of which.

DETAILED DESCRIPTION OF THE PREFERRED EMBODIMENTS

Figure 1:
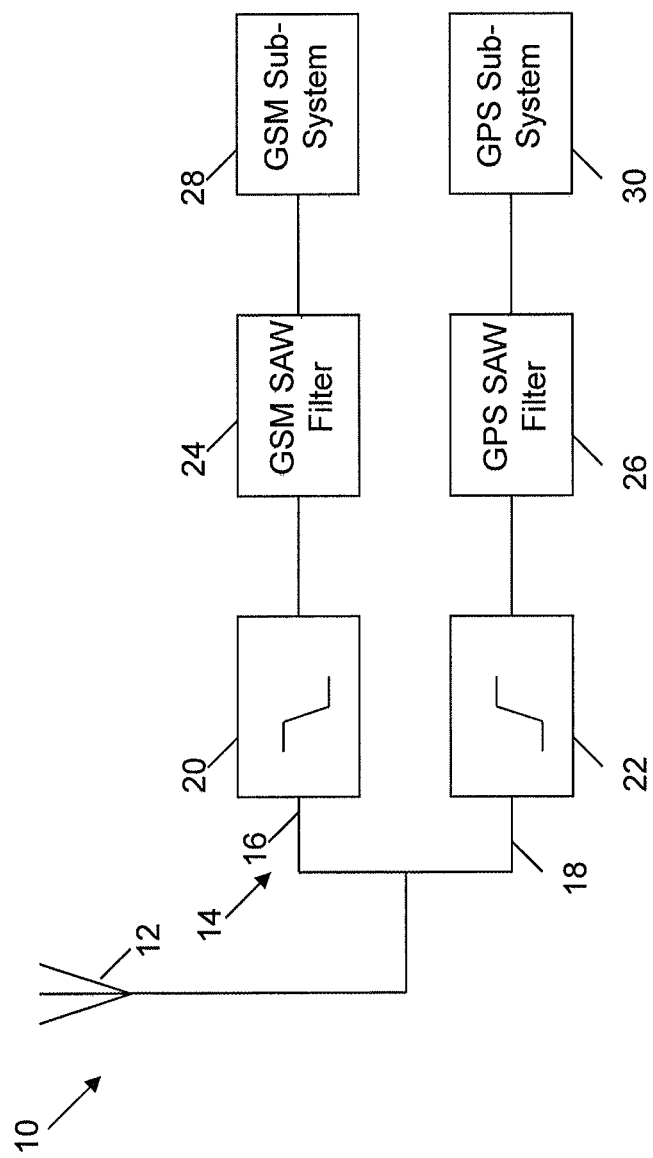
FIG. 1 is a schematic representation of known architecture for use in a device having both GSM and GPS receivers.
Figure 2:
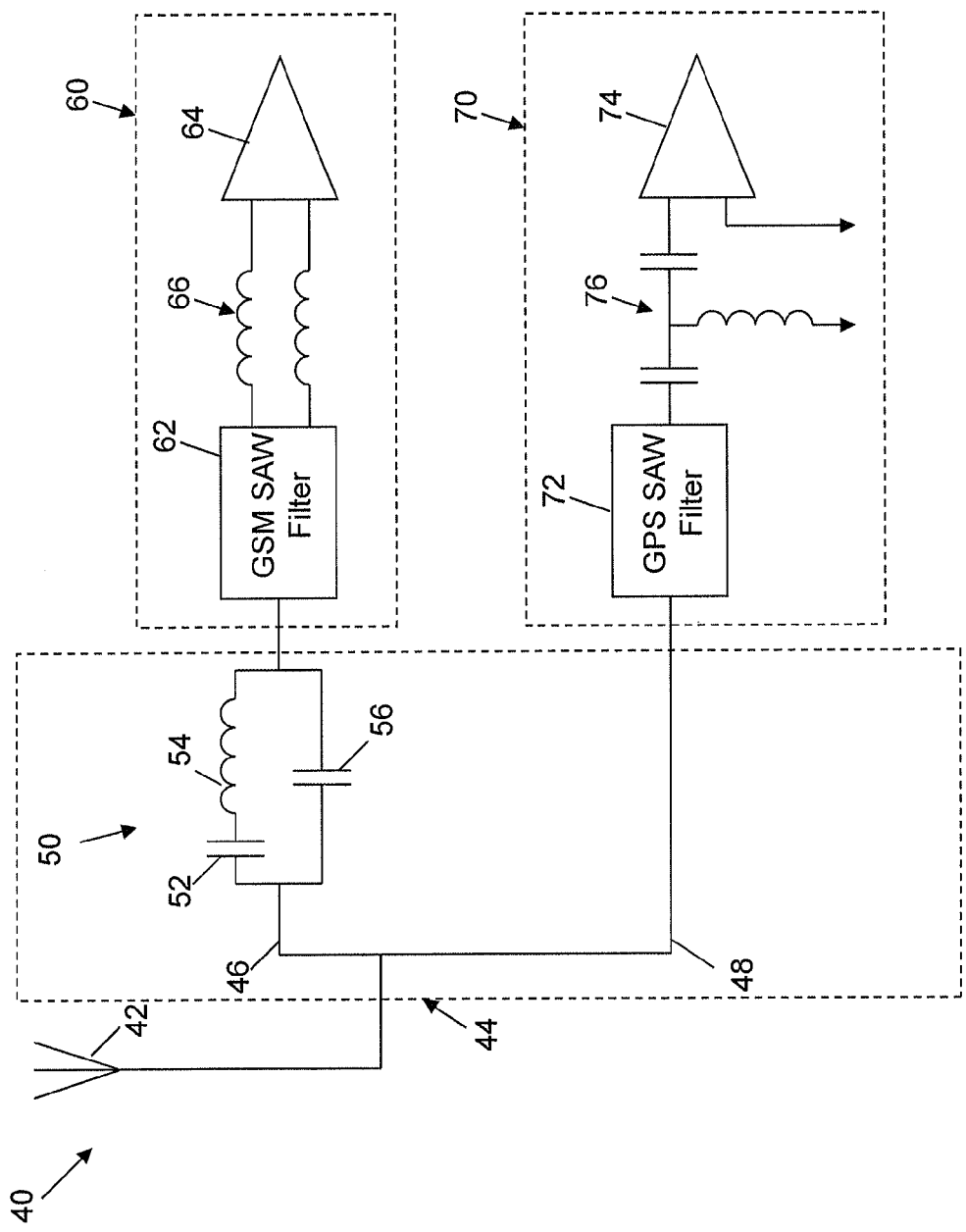
FIG. 2 is a schematic representation of a receiver architecture including a diplexer according to an embodiment of the present invention.

Referring to FIG. 2, an architecture for use in a front end module of a receiver is shown generally at 40. For reasons of clarity and brevity only those components that are relevant to the present invention are illustrated in FIG. 2, but it will be appreciated that the receiver 40 will include many other components.

The receiver 40 has a single antenna 42 which is able to receive GSM signals in the 869-960 MHz frequency band used by the GSM 850 and GSM 900 standards and GPS signals in the 1574-1576 MHz frequency band. The antenna 42 is connected to a diplexer 44 which has parallel first and second branches 46, 48. It will be appreciated that the diplexer 44 is a form of multiplexer.

The first branch 46 couples the antenna 42 to a GSM processing sub-system 60, and includes a diplex filter 50 with a pass-band having a frequency range of 869 MHz to 960 MHz and a stop-band having a frequency range of 1574 MHz to 1576 MHz, so as to pass signals in the GSM frequency band but block signals at the higher GPS frequencies. In this example the diplex filter 50 is a passive device made up of a capacitor 52 and an inductor 54 connected in series, with a further capacitor 56 being connected in parallel with the series capacitor 52 and inductor 54. The values of the capacitors 52, 56 and the inductor 54 are chosen so that in the illustrated configuration they form a diplex filter with the required pass-band and stop-band. For example, the capacitor 52 may have a value of 3.3 picofarads, the inductor 54 may have a value of 10 nanohenries and the capacitor 56 may have a value of 1.2 picofarads. However, those skilled in the relevant art will appreciate that different component values could be used to create the same effect, and that any filter having the required characteristics could perform the function of the diplex filter 50.

An output of the diplex filter 50 is coupled to an input of the GSM processing sub-system 60, which includes a surface acoustic wave (SAW) filter 62, a low-noise amplifier (LNA) 64 and a matching section 66 for matching the output impedance of the SAW filter 62 to the input impedance of the LNA 64. An output of the LNA 64 is coupled to additional components (not shown) of the receiver 40 for further processing of a received GSM signal.

The second branch 48 couples the antenna 42 directly to a GPS sub-system 70, in the sense that in contrast to the prior art system 10 described above, the second branch 48 does not contain a high-pass filter 16 or any other additional components which would attenuate a received signal passing through the second branch 48. Thus, any signal received by the antenna 42 is passed directly to the GPS sub-system 70 by the second branch 48 without any substantial attenuation other than that which occurs as a result of the signal passing through the second branch 48, i.e. without any additional attenuation due to other components in the second branch 48.

The GPS sub-system 70 includes a SAW filter 72 and a GPS low noise amplifier (LNA) 74. An input of the LNA 74 is coupled to an output of the SAW filter 72 by a matching section 76, which matches the input impedance of the LNA 74 to the output impedance of the SAW filter 72.

At GPS frequencies the first branch 46 presents an open circuit to the antenna 42 due to the diplex filter 50. Thus substantially the whole of the received signal is passed by the second branch 48 to the GPS sub-system 70. In contrast to the prior art system 10 described above, the second branch 48 does not include a high-pass filter 16, and thus the insertion losses associated with such a high-pass filter are avoided here. Typically the second branch 48 has a total loss of around 0.07 dB, which contrasts with a much greater loss of up to around 0.5 dB incurred by the prior art system 10 described above as a result of the insertion loss of the high-pass filter 16.

As GSM frequencies the diplex filter 50 is effectively a short circuit, so a signal received by the antenna 42 is passed to the GSM sub-system 60 by the first branch 46. As there is no filter in the second branch 48, a proportion of the received signal is also passed to the GPS sub-system 70, which gives rise to an additional loss of around 1.5 dB in the GSM sub-system 60.

The diplexer 44 thus improves the performance of the GPS sub-system 70 by reducing the attenuation of a received GPS signal at the expense of reduced performance of the GSM sub-system 60. This compromise is generally acceptable, as GSM signals are typically stronger than GPS signals and good performance in relation to reception of GPS signals is seen by many device manufacturers as more desirable than good performance in relation to reception of GSM signals. In hand with this, the diplexer 44 provides a reduced-cost option in comparison to prior art devices as it contains fewer components. This also allows the diplexer 44 to be smaller than prior art devices, and provides a greater degree of design flexibility.

Although in the example described above the first and second branches 46, 48 are configured for reception of GSM and GPS signals respectively, it will be appreciated that the principles of the present invention can be applied to received signals transmitted in accordance with other telecommunications standards. For example, FIG. 3 is a schematic illustration of an architecture which can be used in a device having both Bluetooth® and GPS receivers.

Figure 3:
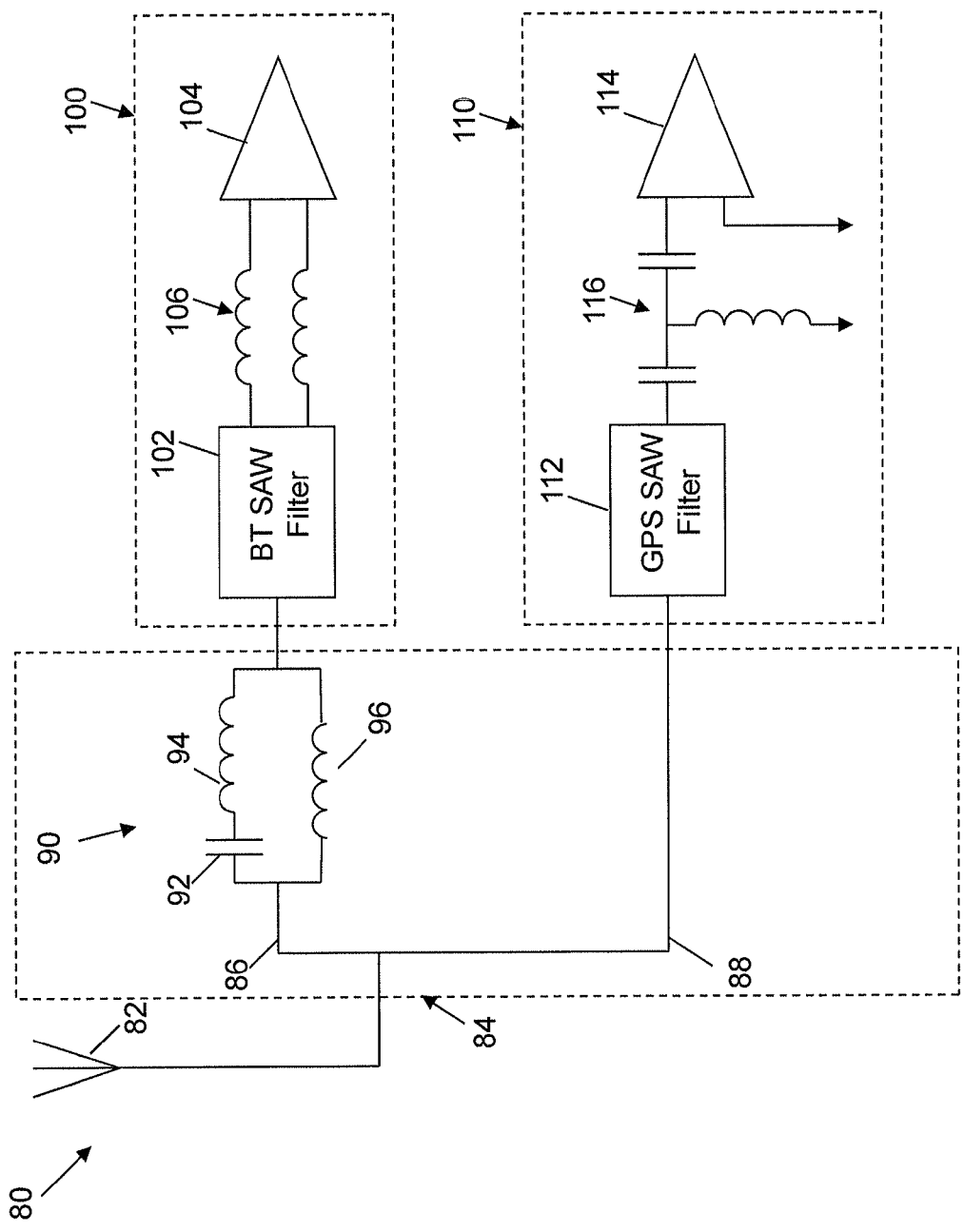
FIG. 3 is a schematic representation of a receiver architecture for use in a device having both Bluetooth® and GPS receivers according to an embodiment of the present invention.

In the embodiment shown generally at 80 in FIG. 3, an antenna 82 is able to receive both GPS signals in the 1574 MHz to 1576 MHz range and Bluetooth® signals in the 2.4 GHz range.

The antenna 82 is coupled to a diplexer 84 which has first and second branches 86, 88. The first branch 86 couples the antenna 82 to a Bluetooth® processing sub-system 100, which includes a surface acoustic wave (SAW) filter 102, a low-noise amplifier (LNA) 104 and a matching section 106 for matching the output impedance of the SAW filter 102 to the input impedance of the LNA 104. An output of the LNA 104 is coupled to additional components (not shown) of the receiver 80 for further processing of a received Bluetooth® signal.

The first branch 86 includes a diplex filter 90 with a pass-band having a frequency range of 2.4 GHz to 2.4835 GHz and a stop-band having a frequency range of 1574 MHz to 1576 MHz, so as to pass signals in the Bluetooth® frequency band but block signals at the lower GPS frequencies.

In this example the diplex filter 90 is a passive device made up of a capacitor 92 and an inductor 94 connected in series, with a further inductor 96 being connected in parallel with the series capacitor 92 and inductor 94. The values of the capacitor 92 and the inductors 94, 96 are chosen so that in the illustrated configuration they form a diplex filter with the required pass-band and stop-band. Appropriate component values will be readily apparent to those skilled in the relevant art. Moreover, it will be understood that any filter having the required characteristics could perform the function of the diplex filter 90.

As in the embodiment shown in FIG. 2, the second branch 88 couples the antenna 82 directly to a GPS sub-system 110, in the sense that in contrast to the prior art system 10 described above, the second branch 88 does not contain a high-pass filter 16 or any other additional components which would attenuate a received signal passing through the second branch 88. Thus, any signal received by the antenna 82 is passed directly to the GPS sub-system 110 by the second branch 88 without any substantial attenuation other than that which occurs as a result of the signal passing through the second branch 88, i.e. without any additional attenuation due to other components in the second branch 88.

As in the embodiment illustrated in FIG. 2, the GPS sub-system 110 includes a SAW filter 112 and a GPS low noise amplifier (LNA) 114. An input of the LNA 114 is coupled to an output of the SAW filter 112 by a matching section 116, which matches the input impedance of the LNA 114 to the output impedance of the SAW filter 112.

At GPS frequencies the first branch 86 presents an open circuit to the antenna 82 due to the diplex filter 90. Thus substantially the whole of the received signal is passed by the second branch 88 to the GPS sub-system 110. In contrast to the prior art system 10 described above, the second branch 88 does not include a high-pass filter 16, and thus the insertion losses associated with such a high-pass filter are avoided here.

As Bluetooth® frequencies the diplex filter 90 is effectively a short circuit, so a signal received by the antenna 82 is passed to the Bluetooth® sub-system 100 by the first branch 86. As there is no filter in the second branch 88, a proportion of the received signal is also passed to the Bluetooth® sub-system 100, which gives rise to an additional loss of around 1.5 dB in the Bluetooth® sub-system 100. As with the embodiment illustrated in FIG. 2, the diplexer 84 improves the performance of the GPS sub-system 70 by reducing the attenuation of a received GPS signal at the expense of reduced performance of the Bluetooth® sub-system 100. This compromise is generally acceptable, as Bluetooth® signals are typically stronger than GPS signals and good performance in relation to reception of GPS signals is seen by many device manufacturers as more desirable than good performance in relation to reception of Bluetooth® signals.

It will be appreciated that the present invention is equally suited to other telecommunications standards such as IEEE 802.11 (Wi-Fi™). Moreover, the diplexer 44, 84 could include additional branches (meaning that it can no longer be referred to as a diplexer, but only by the more general term multiplexer), with each branch coupling the antenna 42, 82 to a sub-system for processing signals transmitted in accordance with a different telecommunications standard.

The diplexer 44, 84 (or multiplexer) can be implemented in a number of ways. For example, the diplexer 44, 84 may be implemented using discrete components surface-mounted on a circuit board of a receiver 40, 80 or of a front-end module for use in a receiver 40, 80.

While preferred embodiments of the invention have been set forth above, those skilled in the art who have reviewed the present disclosure will readily appreciate that other embodiments can be realized within the scope of the invention. For example, numerical values are illustrative rather than limiting, as are recitations of specific telecommunication protocols. Therefore, the present invention should be construed as limited only by the appended claims.

What is claimed is:

1. A diplexer for a device capable of receiving signals in first and second frequency bands, the diplexer comprising:
 a first branch for connecting an antenna to a first receiver sub-system configured to process signals received by the antenna in the first frequency band; and
 a second branch for connecting the antenna to a second receiver sub-system configured to process signals received by the antenna in the second frequency band; wherein
 the first branch comprises a filter for attenuating received signals in the second frequency band and the second branch does not include a filter, but instead couples the antenna directly to the second sub-system such that a signal received by the antenna is passed directly to the second sub-system by the second branch without any substantial attenuation other than that which occurs as a result of the signal passing through the second branch.

2. A diplexer according to claim 1 wherein the filter of the first branch comprises a diplex filter.

3. A diplexer according to claim 1 wherein the signals received by the antenna in the first frequency band are transmitted in accordance with a first telecommunications standard and the signals received by the antenna in the second frequency band are transmitted in accordance with a second telecommunications standard.

4. A diplexer according to claim 3 wherein the first telecommunications standard is GSM.

5. A diplexer according to claim 3 wherein the first telecommunications standard is Bluetooth®.

6. A diplexer according to claim 3 wherein the second telecommunications standard is GPS.

7. A receiver for a device capable of receiving signals in a plurality of frequency bands, the receiver comprising an antenna coupled to a diplexer according to claim 1.

8. A front-end module for a receiver for a device capable of receiving signals in a plurality of frequency bands, the front-end module comprising a diplexer according to claim 1.

* * * * *

UNITED STATES PATENT AND TRADEMARK OFFICE
CERTIFICATE OF CORRECTION

PATENT NO. : 8,879,439 B2  Page 1 of 1
APPLICATION NO. : 12/886687
DATED : November 4, 2014
INVENTOR(S) : Jones It is certified that error appears in the above-identified patent and that said Letters Patent is hereby corrected as shown below:

In the Specification

In Column 1, Line 53, delete "filter 20." and insert -- filter 20, --, therefor.

In Column 3, Line 44, delete "filter 16" and insert -- filter 22 --, therefor.

In Column 3, Line 62, delete "filter 16," and insert -- filter 22, --, therefor.

In Column 3, Line 67, delete "filter 16." and insert -- filter 22. --, therefor.

In Column 5, Line 15, delete "filter 16," and insert -- filter 22, --, therefor.

Signed and Sealed this
Third Day of March, 2015

Michelle K. Lee
*Deputy Director of the United States Patent and Trademark Office*